(12) United States Patent
Huo et al.

(10) Patent No.: US 10,483,338 B2
(45) Date of Patent: Nov. 19, 2019

(54) ORGANIC LIGHT-EMITTING DISPLAY PANEL, MANUFACTURING METHOD THEREOF, AND ORGANIC LIGHT-EMITTING DISPLAY DEVICE

(71) Applicant: SHANGHAI TIANMA MICRO-ELECTRONICS CO., LTD., Shanghai (CN)

(72) Inventors: Sitao Huo, Shanghai (CN); Guofeng Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/057,759

(22) Filed: Aug. 7, 2018

(65) Prior Publication Data
US 2018/0350888 A1    Dec. 6, 2018

(30) Foreign Application Priority Data

Apr. 2, 2018 (CN) .......................... 2018 1 0281982

(51) Int. Cl.
*H01L 27/32* (2006.01)
*H01L 51/00* (2006.01)

(52) U.S. Cl.
CPC ...... *H01L 27/3258* (2013.01); *H01L 27/3218* (2013.01); *H01L 27/3246* (2013.01); *H01L 51/0005* (2013.01); *H01L 2227/323* (2013.01)

(58) Field of Classification Search
CPC ............. H01L 27/3258; H01L 27/3218; H01L 27/3246; H01L 51/0005; H01L 2227/323
See application file for complete search history.

(56) References Cited

U.S. PATENT DOCUMENTS

2009/0128020 A1* 5/2009 Takei .................. H01L 27/3223
                                                  313/504
2014/0118822 A1* 5/2014 Wu ..................... G02B 27/2214
                                                  359/462
(Continued)

FOREIGN PATENT DOCUMENTS

CN        102474934 B    12/2014

*Primary Examiner* — Mark W Tornow
(74) *Attorney, Agent, or Firm* — Kilpatrick Townsend & Stockton, LLP

(57) ABSTRACT

The present disclosure provides organic light-emitting display panel, manufacturing method, and organic light-emitting display device. Organic light-emitting display panel includes: array substrate, planarization layer, pixel defining layer, and multiple organic light-emitting devices. The pixel defining layer has multiple pixel apertures, each of which is provided therein with at least two organic light-emitting devices for emitting a same color. Anodes of the organic light-emitting devices are one-to-one electrically connected to pixel driving circuits on the array substrate. The planarization layer is provided with multiple grooves, which are disposed between any adjacent two organic light-emitting devices in each pixel aperture and are filled with hydrophobic layer. The hydrophobic layer is provided with multiple trenches. Extending direction of each groove is the same as extending direction of each trench. The organic light-emitting function layer breaks at each trench. The present disclosure can improve display effect of organic light-emitting display panel.

19 Claims, 6 Drawing Sheets

(56) References Cited

U.S. PATENT DOCUMENTS

| | | | | |
|---|---|---|---|---|
| 2014/0354139 A1* | 12/2014 | Yoon | ............... | H05B 33/12 |
| | | | | 313/498 |
| 2015/0001514 A1* | 1/2015 | Goto | ............... | H01L 27/3218 |
| | | | | 257/40 |
| 2017/0213878 A1* | 7/2017 | Song | ............... | H01L 25/0655 |

\* cited by examiner

ORGANIC LIGHT-EMITTING DISPLAY PANEL, MANUFACTURING METHOD THEREOF, AND ORGANIC LIGHT-EMITTING DISPLAY DEVICE

CROSS-REFERENCE TO RELATED APPLICATIONS

The present disclosure claims priority to Chinese Patent Application No. 201810281982.4, filed on Apr. 2, 2018, the content of which is incorporated herein by reference in its entirety.

TECHNICAL FIELD

The present disclosure relates to the field of display technologies, and in particular, to an organic light-emitting display panel, a manufacturing method thereof, and an organic light emitting display device.

BACKGROUND

With the rapid development of the flat panel display technologies, an organic light-emitting display panel (OLED) has more and more applications due to its excellent characteristics such as self-luminescence, high brightness, wide viewing angle, and quick response.

An organic light-emitting display panel according to the related art includes an array substrate and a pixel defining layer and a plurality of organic light-emitting devices provided on the array substrate. The pixel defining layer includes a plurality of pixel apertures, and the plurality of organic light-emitting devices is disposed in the plurality of pixel apertures. In order to achieve high-resolution display of the organic light-emitting display panel, at least two organic light-emitting devices for emitting a same color are disposed in one pixel aperture. During the displaying process, each organic light-emitting device in one pixel aperture can be independently controlled, thereby improving the resolution.

It has been found that, when manufacturing organic light-emitting function layers of organic light-emitting devices by means of ink-jet printing, organic light-emitting function layers of adjacent organic light-emitting devices could be inevitably connected with each other to form a whole structure and cannot be manufactured independently. As a result, organic light-emitting devices will influence each other, thereby greatly decreasing the display effect of the organic light-emitting display panel and impacting the human perception.

SUMMARY

The present disclosure provides an organic light-emitting display panel, a manufacturing method thereof, and an organic light-emitting display device, which can improve display effect of the organic light-emitting display panel.

In one embodiment, the present disclosure provides an organic light-emitting display panel, and the organic light-emitting display panel includes: an array substrate; a plurality of pixel driving circuits disposed on the array substrate; a planarization layer disposed on the array substrate, and connection holes corresponding to the plurality of pixel driving circuits is provided in the planarization layer; a pixel defining layer disposed on the planarization layer, and the pixel defining layer includes pixel apertures; and organic light-emitting devices. At least two organic light-emitting devices of the plurality of organic light-emitting devices for emitting a same color are disposed in each of the plurality of pixel apertures, each of the plurality of organic light-emitting devices includes an anode and at least one organic light-emitting function layer, and anodes of the plurality of organic light-emitting devices are electrically connected to the plurality of pixel driving circuits through the plurality of connection holes in one-to-one correspondence. A plurality of grooves is provided in the planarization layer. One groove of the plurality of grooves is disposed between two adjacent organic light-emitting devices of the plurality of organic light-emitting devices disposed in a respective one of the plurality of the pixel apertures. The plurality of grooves is filled with a hydrophobic layer having a trench, an extending direction of the trench in each groove of the plurality of grooves is the same as an extending direction of said groove.

In one embodiment, the present disclosure provides an organic light-emitting display device including the above-mentioned organic light-emitting display panel.

In one embodiment, the present disclosure provides a manufacturing method applicable to the abovementioned organic light-emitting display panel. The manufacturing method includes steps of: providing an array substrate on which a plurality of pixel driving circuits is provided; forming a planarization layer on the array substrate; forming, in the planarization layer, a plurality of connection holes corresponding to the plurality of pixel driving circuits; forming a plurality of grooves in the planarization layer; filling each of the plurality of grooves with a hydrophobic material to form a hydrophobic layer; forming a trench in the hydrophobic layer; forming a plurality of anodes included by a plurality of organic light-emitting devices, and the plurality of anodes is electrically connected to the plurality of pixel driving circuits through the plurality of connection holes in one-to-one correspondence; forming a pixel defining layer on the array substrate having the plurality of anodes, and the pixel defining layer includes pixel apertures, and each of the plurality of pixel apertures corresponds to at least two of the plurality of organic light-emitting devices; and forming at least one organic light-emitting function layer of each of the plurality of organic light-emitting devices by means of ink-jet printing. At least two of the plurality of organic light-emitting devices for emitting a same color are disposed in each of the plurality of pixel apertures. One of the plurality of grooves is disposed between two adjacent organic light-emitting devices of the plurality of organic light-emitting devices disposed in a respective one of the plurality of the pixel apertures, and an extending direction of the trench in each groove of the plurality of grooves is the same as an extending direction of said groove.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. The drawings described as follows are merely part of the embodiments of the present disclosure.

DESCRIPTION OF EMBODIMENTS

The described embodiments are merely exemplary embodiments of the present disclosure, which shall not be interpreted as limiting the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
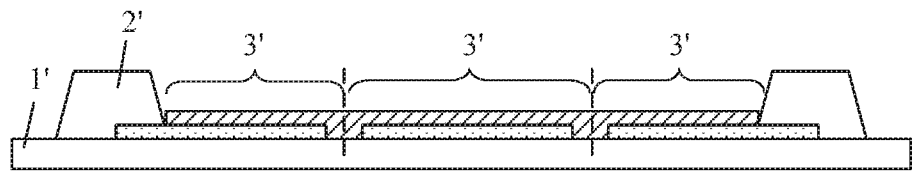
FIG. 1 is a schematic cross-sectional view of an organic light-emitting display panel in the related art.

As shown in FIG. 1, FIG. 1 is a schematic cross-sectional view of an organic light-emitting display panel in the related art. The organic light-emitting display panel includes an array substrate 1', and a pixel defining layer 2' and a plurality of organic light-emitting devices 3' provided on the array substrate 1'. The pixel defining layer 2' has a plurality of pixel apertures, and the plurality of organic light-emitting devices 3' is disposed in the plurality of pixel apertures. In order to achieve high-resolution display of the organic light-emitting display panel, at least two organic light-emitting devices 3' for emitting a same color are disposed in one pixel aperture. During the displaying process, each organic light-emitting device 3' in one pixel aperture can be independently controlled, thereby improving the resolution.

Figure 2:
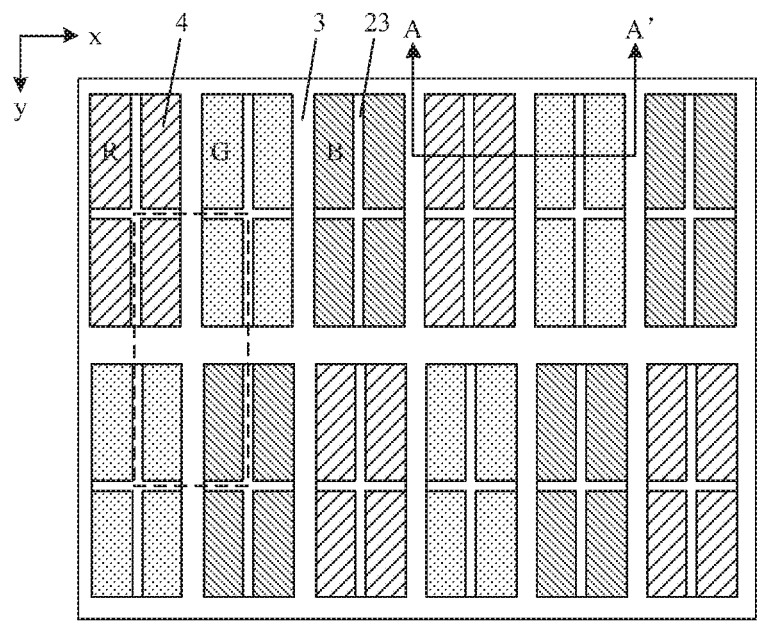
FIG. 2 is top view I of an organic light-emitting display panel according to an embodiment of the present disclosure.
Figure 3:
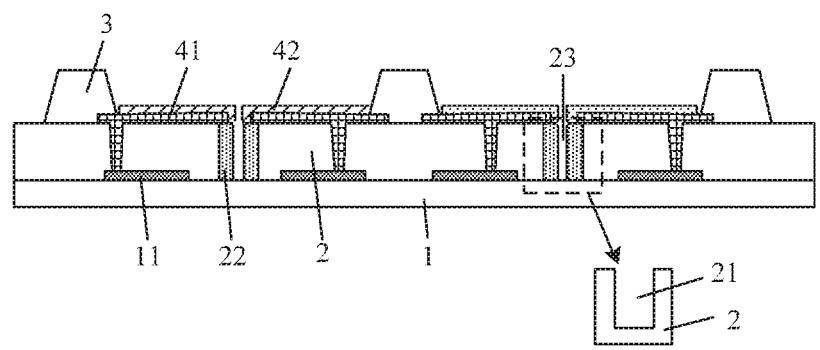
FIG. 3 is schematic cross-sectional view I along AA' direction of FIG. 2 according to an embodiment of the present disclosure.
Figure 4:
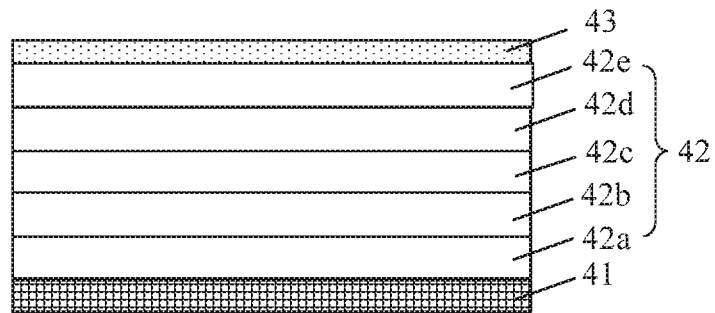
FIG. 4 is a structural schematic diagram of an organic light-emitting device according to an embodiment of the present disclosure.

An embodiment of the present disclosure provides an organic light-emitting display panel, as shown in FIG. 2, FIG. 3, and FIG. 4. FIG. 2 is top view I of an organic light-emitting display panel according to an embodiment of the present disclosure, FIG. 3 is schematic cross-sectional view I along AA' direction of FIG. 2 according to an embodiment of the present disclosure, and FIG. 4 is a structural schematic diagram of an organic light-emitting device according to an embodiment of the present disclosure. The organic light-emitting display panel includes an array substrate 1, a planarization layer 2, a pixel defining layer 3 and a plurality of organic light-emitting devices 4. A plurality of pixel driving circuits is provided on the array substrate 1. The planarization layer 2 is disposed on the array substrate 1, and a plurality of connecting holes corresponding to the plurality of pixel driving circuits 11 is provided in planarization layer 2. The pixel defining layer 3 is disposed on the planarization layer 2 and includes a plurality of pixel apertures. At least two organic light-emitting devices 4 for emitting a same color are disposed in each pixel aperture. Each organic light-emitting device 4 includes an anode 41 and at least one organic light-emitting function layer 42. Anodes 41 are electrically connected to the pixel driving circuits 11 through connecting holes in one-to-one correspondence. Further, a plurality of grooves 21 is provided in the planarization layer 2 (with reference to an enlarged view of the planarization layer 2 in the dashed line area in FIG. 3). The groove 21 is disposed between two adjacent organic light-emitting devices 4 in a respective pixel aperture. The groove 21 is filled with a hydrophobic layer 22 having a trench 23. An extending direction of the trench 23 is the same as an extending direction of the groove 21. The organic light-emitting function layer 42 breaks at each trench 23.

It should be noted that, the abovementioned "the groove 21 is filled with a hydrophobic layer 22" means that the hydrophobic layer 22 fills in the overall groove 21, that is, an upper surface of the hydrophobic layer 22 and a top portion of the grooves 21 are located in a same plane. The abovementioned "the organic light-emitting function layer 42 breaks at each trench 23" means that a part of the organic light-emitting function layer 42 located at one side of each trench 23 and another part of the organic light-emitting function layer 42 located at another side of the trench 23 are independent and not connected. If the organic light-emitting device 4 includes a plurality of organic light-emitting function layers 42, all of the organic light-emitting function layers 42 will break at each trench 23.

With the abovementioned structure of the organic light-emitting display panel in the embodiments of the present disclosure, it brings at least the following beneficial effects.

On the one hand, the pixel defining layer 3 included in the organic light-emitting display panel includes a plurality of pixel apertures, at least two organic light-emitting devices 4 for emitting a same color are disposed in each pixel aperture, the organic light-emitting device 4 includes a anode 41 and at least one organic light-emitting function layer 42, and anodes 41 are electrically connected to pixel driving circuits 11 through connecting holes in one-to-one correspondence. As a result, on the premise of a certain number of pixel apertures, the resolution can be improved by using a respective pixel driving circuit 11 for independently controlling organic light-emitting devices 4 in a respective pixel aperture. The abovementioned "at least two organic light-emitting devices 4 for emitting a same color are disposed in each pixel aperture" will be further described by way of example in the following.

On the other hand, the planarization layer 2 is provided therein with a plurality of grooves 21, the groove 21 is disposed between two adjacent organic light-emitting devices 4 in a respective one pixel aperture, the groove 21 is filled with a hydrophobic layer 22, the hydrophobic layer 22 is provided with a plurality of trenches 23, and an extending direction of each trench 23 is the same as an extending direction of each groove 21. As a result, when each organic light-emitting function layer 42 is formed by means of ink-jet printing, a wet film will cover the hydrophobic layer 22 and the trench 23 provided therein in a wet film status. However, solid content in the wet film is small (generally about 5%), and the hydrophobic layer 22 has hydrophobicity and is provided therein with a plurality of trenches 23, therefore, the formed film layer will break at the trench 23 after the wet film is dried, such that the organic light-emitting function layer 42 breaks at each trench 23, and thus the mutual influence between organic light-emitting devices 4 can be avoided, thereby effectively improving the display effect of the organic light-emitting display panel and improving the human perception.

From the above descriptions, in the above technical solutions, the arrangement of the groove 21 in the planarization layer 2, the arrangement of the hydrophobic layer 22 in the groove 21, and the arrangement of the trench 23 in the hydrophobic layer 22 all have great influence on luminescent property of the organic light-emitting device 4. The abovementioned embodiments will be described by way of example in the following.

In one embodiment, an arrangement of the groove 21 in the planarization layer 2 will be described in the following.

The inventor found that, if a depth of the groove 21 is too small, a thickness of the hydrophobic layer 22 filled therein would be small, and a depth of the trench 23 formed in the hydrophobic layer 22 would be small, which adversely affects breaking of the organic light-emitting function layer 42 at each trench 23. If the depth of the groove 21 is too large, other structures on the array substrate 1 such as the pixel driving circuit 11 may be easily damaged during the process of forming the groove 21. Therefore, a reasonable choice of the depth of the groove 21 is necessary. In one embodiment, in an embodiment of the present disclosure, as shown in FIG. 3, the depth of the groove 21 is equal to the thickness of the planarization layer 2 in the direction perpendicular to the array substrate 1, that is, the planarization layer 2 at the position of the groove 21 is completely removed when forming the groove 21, such that the depth of the groove 21 is large and does not influence other structures on the array substrate 1.

The depth of the groove 21 may be changed according to practical needs. For example, the depth of the groove 21 can be smaller than the thickness of the planarization layer 2, or the depth of the groove 21 can be larger than the thickness of the planarization layer 2.

In one embodiment, an arrangement of the hydrophobic layer 22 in the groove 21 will be described in the following.

Figure 5:
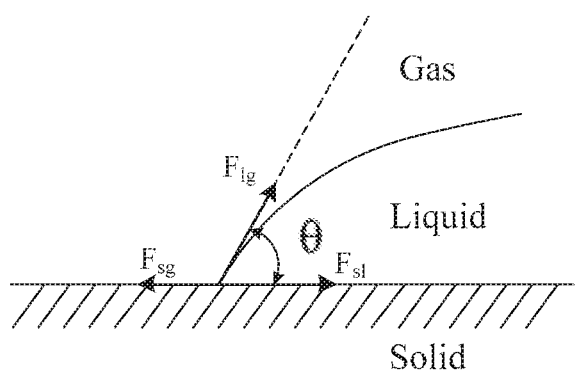
FIG. 5 is a schematic diagram illustrating a wetting angle according to an embodiment of the present disclosure.

A hydrophobic effect of the hydrophobic layer 22 in this embodiment of the present disclosure has a great influence on performance of the organic light-emitting display panel. The hydrophobic effect of the hydrophobic layer 22 can be described by means of a wetting angle formed by water dropping on the hydrophobic layer 22. As shown in FIG. 5. which is a schematic diagram illustrating a wetting angle according to an embodiment of the present disclosure, the wetting angle θ is an angle formed between a gas-liquid interface and a solid-liquid interface at three-phase interfaces of solid, liquid and gas. From a thermodynamic point of view, when a liquid droplet drops onto a clean and smooth solid surface, ignoring the influences of gravity and viscosity of the liquid, surface tension of the liquid droplet on the solid surface is determined by three interface tensions of solid-gas ($F_{sg}$), solid-liquid ($F_{sl}$), and liquid-gas ($F_{lg}$), and the equilibrium relationship thereof is denoted as:

$$F_{sg}=F_{sl}+F_{lg}*\cos\theta;$$

$$F=F_{lg}*\cos\theta=F_{sg}-F_{sl},$$

where θ is wetting angle, and F is wetting tension.

In one embodiment, when θ=0°, the wetting tension F is maximal and can completely wet, that is, the liquid spreads freely on the solid surface; when 0°<θ<90°, the wetting effect gets worse as θ increases; when θ≥90°, the wetting tension is small and can hardly wet; and when θ=180°, it means no wetting at all.

Therefore, the larger the wetting angle θ of the hydrophobic layer is, the better the hydrophobic effect of the hydrophobic layer 22 is. Based on this, in an exemplary embodiment of the present disclosure, the wetting angle of the hydrophobic layer 22 is selected to be larger than 90°, such as 100°, such that the hydrophobic layer 22 has a good hydrophobic effect. In order to satisfy the above requirements for the hydrophobic layer 22, In one embodiment, the hydrophobic layer 22 is made of a fluorine-containing organic material in an embodiment of the present disclosure. For example, the material of the hydrophobic layer 22 is acrylic with good overall performance (which is also called as PMMA or organic glass, and the chemical name is polymethyl methacrylate).

In one embodiment, an arrangement of the trench 23 in the hydrophobic layer 22 will be described in the following.

The inventor found that, if a depth of the trench 23 is too small, and/or, a width of the trench 23 is too large, it would easily cause the organic light-emitting function layer 42 to break at each trench 23 during process of forming the organic light-emitting function layer 42 by means of ink-jet printing. Therefore, the depth and width of the trench 23 should be selected properly. For example, the width of the trench 23 is smaller than 2 μm, and the depth of the trench 23 in the direction perpendicular to the array substrate 1 is larger than or equal to 0.5 μm. In an example, as shown in FIG. 3, the depth of the trench 23 is equal to the depth of the groove 21 in the direction perpendicular to the array substrate 1.

Figure 6:
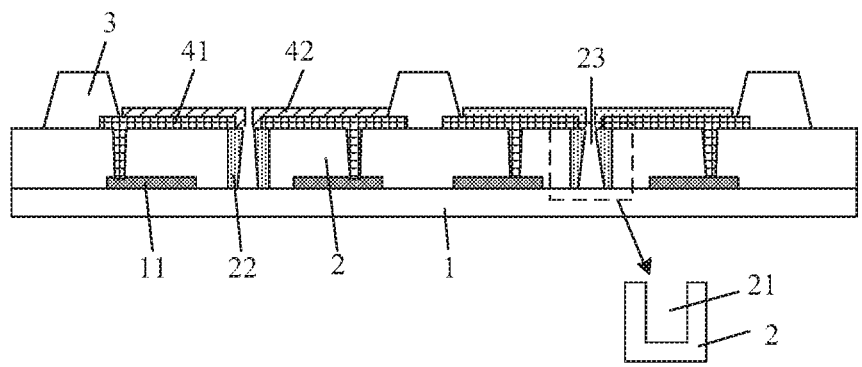
FIG. 6 is schematic cross-sectional view II along AA' direction of FIG. 2 according to an embodiment of the present disclosure.

As shown in FIG. 6, which is schematic cross-sectional view II along AA' direction of FIG. 2 according to an embodiment of the present disclosure, the inventor further found that, when a shape of the cross-section of the trench 23 is a trapezium with a narrow top and a wide bottom, during the process of forming the organic light-emitting function layer 42 by means of ink-jet printing, for example, during process of drying the wet film, if some substance falls into the trench 23, the fallen substance will not be connected to the organic light-emitting function layer 42 at the trench 23 due to the abovementioned shape of the cross-section of the trench 23, and thus it is possible that the organic light-emitting function layer 42 breaks at the trench 23. Therefore, in an embodiment of the present disclosure, the shape of the cross-section of the trench 23 is selected to be a trapezoid with a narrow top and a wide bottom. Considering the difficulty in manufacturing the trench 23 and its breaking effect of the organic light-emitting function layer 42, a basic angle of the trench 23 in an embodiment of the present disclosure can be selected to be larger than 45° and smaller than 90°.

In addition, it is known from the above description that at least two organic light-emitting devices 4 for emitting a same color are disposed in each pixel aperture. On the premise of a certain number of pixel apertures, the resolution can be improved by using a respective pixel driving circuit 11 for independently controlling organic light-emitting devices 4 in a respective one pixel aperture. The number of the organic light-emitting devices 4 for emitting a same color disposed in each pixel aperture will be described by way of example in the following.

In a first example, as shown in FIG. 2, the pixel aperture has a rectangle shape, and four organic light-emitting devices 4 for emitting a same color are disposed in each pixel aperture. In one embodiment, in each pixel aperture, the four grooves 21 are provided in a cross-shape manner for separating the four organic light-emitting devices 4 apart from each other. Each of the four grooves 21 in a respective one pixel aperture is connected at one end to a geometric center of this pixel aperture, and at the other end to a midpoint of a respective one side of this pixel aperture. In this way, the occupied positions of the respective organic light-emitting devices 4 can be relatively concentrated, and the sizes of the respective organic light-emitting devices 4 can be approximately the same, which can facilitate improving the display effect of the organic light-emitting display panel.

Figure 7:
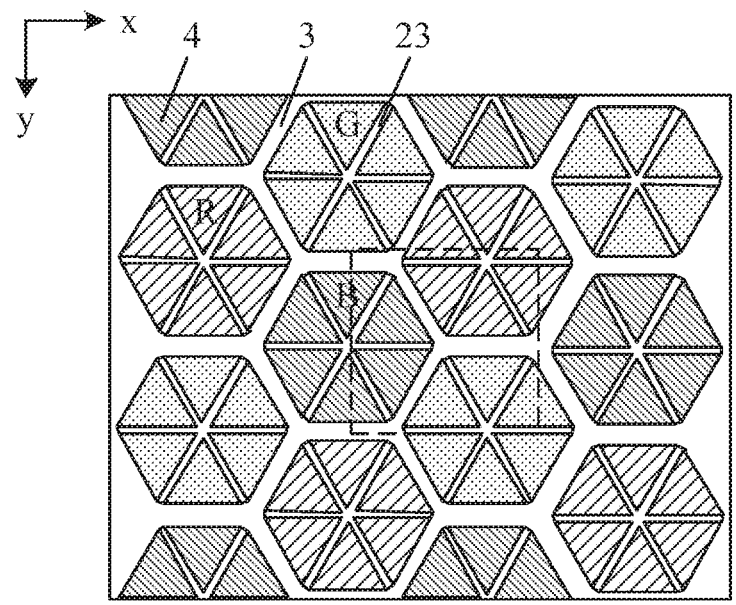
FIG. 7 is top view II of an organic light-emitting display panel according to an embodiment of the present disclosure.

In a second example, as shown in FIG. 7, which is top view II of an organic light-emitting display panel according to an embodiment of the present disclosure, the pixel aperture has a hexagon shape, and six organic light-emitting devices 4 for emitting a same color are disposed in each pixel aperture. In one embodiment, in each pixel aperture, the six grooves 21 are provided in a center-radiation manner for separating the organic light-emitting devices 4 apart from each other. Each of the six grooves 21 in a respective one pixel aperture is connected at one end to a geometric center of this pixel aperture, and at the other end to a respective one vertex of this pixel aperture. In this way, the occupied positions of the respective organic light-emitting devices 4 can be relatively concentrated, and the sizes of the respective organic light-emitting devices 4 can be approximately the same, which can facilitate improving the display effect of the organic light-emitting display panel.

Figure 8:
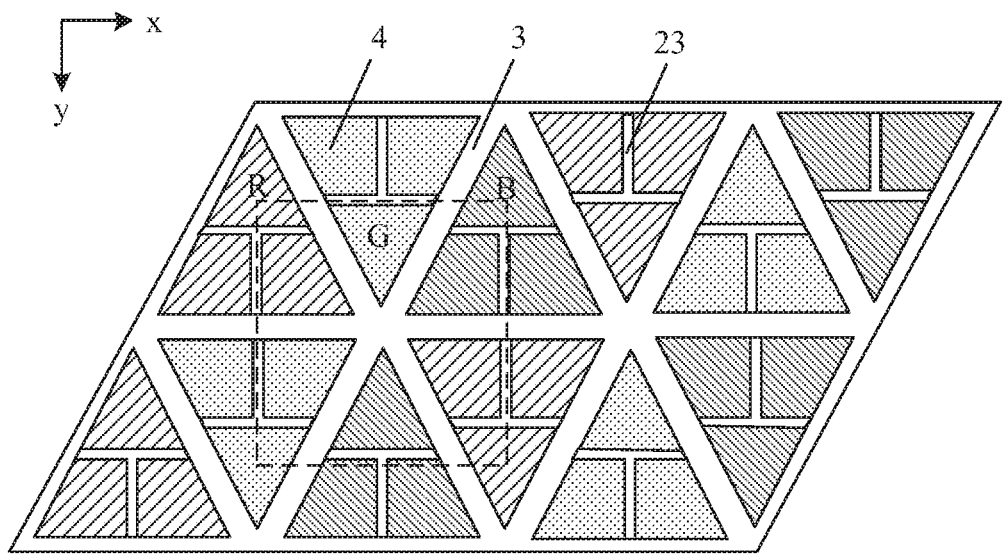
FIG. 8 is top view III of an organic light-emitting display panel according to an embodiment of the present disclosure.

In a third example, as shown in FIG. 8, FIG. 8 is top view III of an organic light-emitting display panel according to an embodiment of the present disclosure. The pixel aperture has a regular triangle shape, and three organic light-emitting devices 4 for emitting a same color are disposed in each pixel aperture. In one embodiment, in each pixel aperture, the six grooves 21 which separate the organic light-emitting devices 4 apart from each other are provided in a T-shape manner, and the connecting point of the three grooves 21 is the geometric center of the pixel aperture. In this way, the occupied positions of the respective organic light-emitting devices 4 can be relatively concentrated, and the sizes of the respective organic light-emitting devices 4 can be approximately the same, which can facilitate improving the display effect of the organic light-emitting display panel.

Other structures included in the organic light-emitting display panel will be described in the following.

In the embodiment of the present disclosure, the circuit structure of the pixel driving circuit 11 provided on the array substrate 1 is not limited, and may be changed according to practical needs. The array substrate 1 generally includes film layers, each of which includes a desired pattern so as to form a pixel driving circuit 11. Each film layer includes a different pattern depending on a different circuit structure of the pixel driving circuit 11, which can be selected by according to practical needs.

As shown in FIG. 4, the organic light-emitting device 4 may include an anode 41, a hole injection layer 42a, a hole transport layer 42b, a light-emitting layer 42c, an electron transport layer 42d, an electron injection layer 42e and a cathode 43, which are sequentially stacked along the direction away from the array substrate 1. The hole injection layer 42a, the hole transport layer 42b, the light-emitting layer 42c, the electron transport layer 42d, and the electron injection layer 42e are all organic light-emitting function layers. That is, the organic light-emitting device 4 includes five organic light-emitting function layers. In this case, the abovementioned "the organic light-emitting function layer 42 breaks at each trench 23" means that the hole injection layer 42a breaks at each trench 23, the hole transport layer 42b breaks at each trench 23, the light-emitting layer 42c breaks at each trench 23, the electron transport layer 42d breaks at each trench 23, and the electron injection layer 42e breaks at each trench 23.

It should be noted that, the cathode 43 included in the organic light-emitting device 4 is not limited in the above description. In one embodiment, the cathodes 43 of all the organic light-emitting devices 4 have a whole layer structure, such that the organic light-emitting display panel can have a simple structure and can be easily driven.

During operating process of the organic light-emitting device 4, the cathode 43 generates electrons, and the anode 41 generates holes. Under the action of an electric field between the cathode 43 and the anode 41, the holes move toward the light-emitting layer 42c through the hole injection layer 42a and the hole transport layer 42b. The electrons move toward the light-emitting layer 42c through the electron injection layer 42e and the electron transport layer 42d. When the holes and electrons meet in the light-emitting layer 42c, the holes and electrons are combined with each other to release energy, such that the organic light-emitting device 4 can emit light.

In one embodiment, as shown in FIG. 2, FIG. 7, and FIG. 8, the organic light-emitting devices 4 can include: organic light-emitting device(s) 4 for emitting red light (represented as R in FIG. 2, FIG. 7, and FIG. 8); organic light-emitting device(s) 4 for emitting green light (represented as G in FIG. 2, FIG. 7, and FIG. 8); and organic light-emitting device(s) 4 for emitting blue light (represented as B in FIG. 2, FIG. 7, and FIG. 8); such that the organic light-emitting display panel can achieve the full color display.

Based on this, in combination with different shapes of the pixel apertures in the pixel defining layer 3, the organic light-emitting devices 4 for emitting various colors in the organic light-emitting display panel may be arranged in various manners, and composition of the display unit during the displaying process may be various. Hereinafter, for convenience of description, a pixel aperture provided with an organic light-emitting device 4 for emitting red color is referred to as a red pixel aperture, a pixel aperture provided with organic light-emitting device 4 for emitting green color is referred to as a green pixel aperture, and a pixel aperture provided with an organic light-emitting device 4 for emitting blue color is referred to as a blue pixel aperture.

In an example, as shown in FIG. 2, when the pixel aperture has a rectangular shape, a red pixel aperture, a green pixel aperture, and a blue pixel aperture are alternately arranged both along x-direction and along y-direction. In one embodiment, in each pixel aperture, the four grooves 21 which separate the four organic light-emitting devices 4 are provided in a cross shape. In this case, the four organic light-emitting devices 4 disposed in the dashed line frame can be used as a display unit for color display.

In another example, as shown in FIG. 7, when the pixel aperture has a hexagon shape, along x-direction, only red pixel apertures are arranged, or only green pixel apertures are arranged, or only blue pixel apertures are arranged; along y-direction, a red pixel aperture, a green pixel aperture and a blue pixel aperture are alternately arranged. In one embodiment, in each pixel aperture, the six grooves 21 which separate the six organic light-emitting devices 4 apart from each other are arranged in a center-radiation manner. In this case, the six organic light-emitting devices 4 disposed in the dashed line frame can be used as a display unit for color display.

In still another example, as shown in FIG. 8, when the pixel aperture has a regular triangle shape, a red pixel aperture, a green pixel aperture, and a blue pixel aperture are alternately arranged both along x-direction and along y-direction. In one embodiment, as shown in FIG. 8, in each pixel aperture, the three grooves 21 which separate the three organic light-emitting devices 4 apart from each other are provided in a T-shape manner. In this case, the six organic light-emitting devices 4 disposed in the dashed line frame can be used as a display unit for color display.

Figure 9:
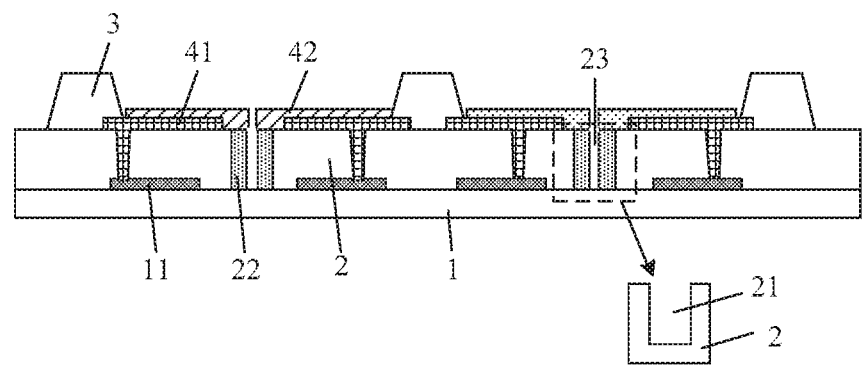
FIG. 9 is schematic cross-sectional view III along AA' direction of FIG. 2 according to an embodiment of the present disclosure.

It should be noted that in the embodiments of the present disclosure, the anode 41 included in the organic light-emitting device 4 is directly formed on the planarization layer 2, the groove 21 filled with the hydrophobic layer 22 is formed in the planarization layer 2, and the sequential order of the two forming would result in different position relationships between the anode 41 and the hydrophobic layer 22. For example, the anode 41 is first formed on the planarization layer 2, and then the groove 21 is formed in the planarization layer 2, then the hydrophobic layer 22 is filled in the groove 21, and the trench 23 is formed in the hydrophobic layer 22. In this case, as shown in FIG. 9, which is schematic cross-sectional view III along AA' direction of FIG. 2 according to an embodiment of the present disclosure, there is a certain distance between an edge of the anode 41 and an edge of the hydrophobic layer 22 (i.e., an edge of the groove 21). Alternatively, the groove 21 is first formed in the planarization layer 2, then the hydrophobic layer 22 is filled in the groove 21, then the trench 23 is formed in the hydrophobic layer 22, and then the anode 41 is formed on the planarization layer 2. In this case, as shown in FIG. 3 and FIG. 6, an end of the anode 41 lies on the hydrophobic layer 22, that is, the edge of the anode 41 exceeds the edge of the hydrophobic layer 22 (i.e., the edge of the groove 21). Of course, the edge of the anode 41 does not exceed that of the trench 23, and otherwise, adjacent anodes 41 will be electrically connected and then independent control of the organic light-emitting devices 4 may not be achieved. An end of the anode 41 lies on the hydrophobic layer 22, such that a coverage range of the anode 41 is large, and a distance between adjacent anodes 41 is small, which can facilitate increasing the aperture ratio of the organic light-emitting display panel.

In addition, the organic light-emitting display panel provided by the embodiments of the present disclosure can be flexible or non-flexible.

When the organic light-emitting display panel is flexible, the substrate of the array substrate 1 is a flexible substrate, such as PI (polyimide), and packaging with respect to the organic light-emitting device should be thin film packaging, so as to satisfy requirement of the organic light-emitting display panel for flexibility and satisfy requirement of the organic light-emitting device for packaging. The packaging thin film can include film layers, such as a three-layer of "inorganic+organic+inorganic" or a five-layer structure. The inorganic layer is used to block water and oxygen, and the organic layer is used to relieve bending stress. A material of the inorganic layer can be silicon nitride, or silicon oxide, etc., and can be formed by means of film-coating (for example, PECVD). A material of the organic layer can be organic silicon compound, aromatic, diphenylbenzene, styrene, etc.

When the organic light-emitting display panel is non-flexible, the substrate of the array substrate 1 is a hard substrate, such as glass, and packaging with respect to the organic light-emitting device may be metal melt packaging, which can be done by means of glass powder packaging, so as to effectively block ambient water and oxygen and avoid failure of the organic light-emitting function layer 42 due to water and oxygen, which can facilitate the normal light emission of the organic light-emitting display panel.

Figure 10:
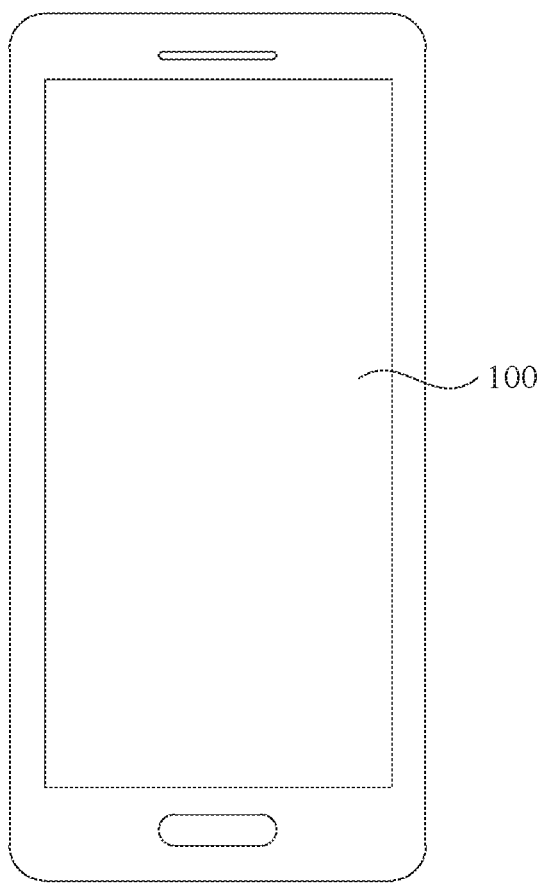
FIG. 10 is a top view of an organic light-emitting display device according to an embodiment of the present disclosure.

The present disclosure provides an organic light-emitting display device. As shown in FIG. 10, which is a top view of an organic light-emitting display device according to an embodiment of the present disclosure, the organic light-emitting display device includes any one of the abovementioned organic light-emitting display panel 100. The organic light-emitting display device provided by the present disclosure can be any product or component that has a display function, such as a smart phone, a wearable smart watch, smart glasses, a tablet computer, a television, a monitor, a notebook computer, a digital photo frame, a navigator, an on-board monitor, an e-book, etc.

An embodiment of the present disclosure further provides a manufacturing method for an organic light-emitting display panel, and the manufacturing method includes the following steps.

At Step S1, an array substrate is provided, on which pixel driving circuits is provided.

At Step S2, a planarization layer is formed on the array substrate.

At Step S3, connecting holes corresponding to pixel driving circuits is provided on the planarization layer.

At Step S4, grooves is provided in the planarization layer.

At Step S5, each of the plurality of grooves is filled with a hydrophobic material to form a hydrophobic layer. The "each of the plurality of grooves is filled with a hydrophobic material" means that the hydrophobic layer fills in the overall groove, that is, an upper surface of the hydrophobic layer and a top portion of the groove are located in the same plane.

At Step S6, a trench is formed in the hydrophobic layer.

At Step S7, on the array substrate having the planarization layer formed thereon, anodes included by organic light-emitting devices is formed, and the plurality of anodes is electrically connected to the plurality of pixel driving circuits through the plurality of connecting holes in one-to-one correspondence.

At Step S8, on the array substrate having anodes formed thereon, a pixel defining layer is formed. The pixel defining layer includes pixel apertures, and each of the plurality of pixel apertures corresponds to at least two organic light-emitting devices.

At Step S9, on the array substrate having anodes formed thereon, at least one organic light-emitting function layer included in each of the plurality of organic light-emitting devices is formed by means of ink-jet printing.

At least two of the plurality of organic light-emitting devices for emitting a same color are disposed in each pixel aperture. The groove is disposed between any adjacent two organic light-emitting devices in each pixel aperture. An extending direction of the groove is the same as an extending direction of the trench, and the organic light-emitting function layer breaks each trench.

The abovementioned "the organic light-emitting function layer breaks at each trench" means that a part of the organic light-emitting function layer located at one side of the trench and another part of the organic light-emitting function layer located at another side of the trench are independent and are not connected. If the organic light-emitting device includes organic light-emitting function layers, all of the organic light-emitting function layers break at the trenches.

It should be noted that the abovementioned step numbers, such as step S1 and step S2, are all intended to facilitate distinguishing steps, other than any limitation to the sequence of steps.

For better illustrating and implementing the present disclosure, two exemplary manufacturing methods for an organic light-emitting display panel will be described in the following.

Figure 11:
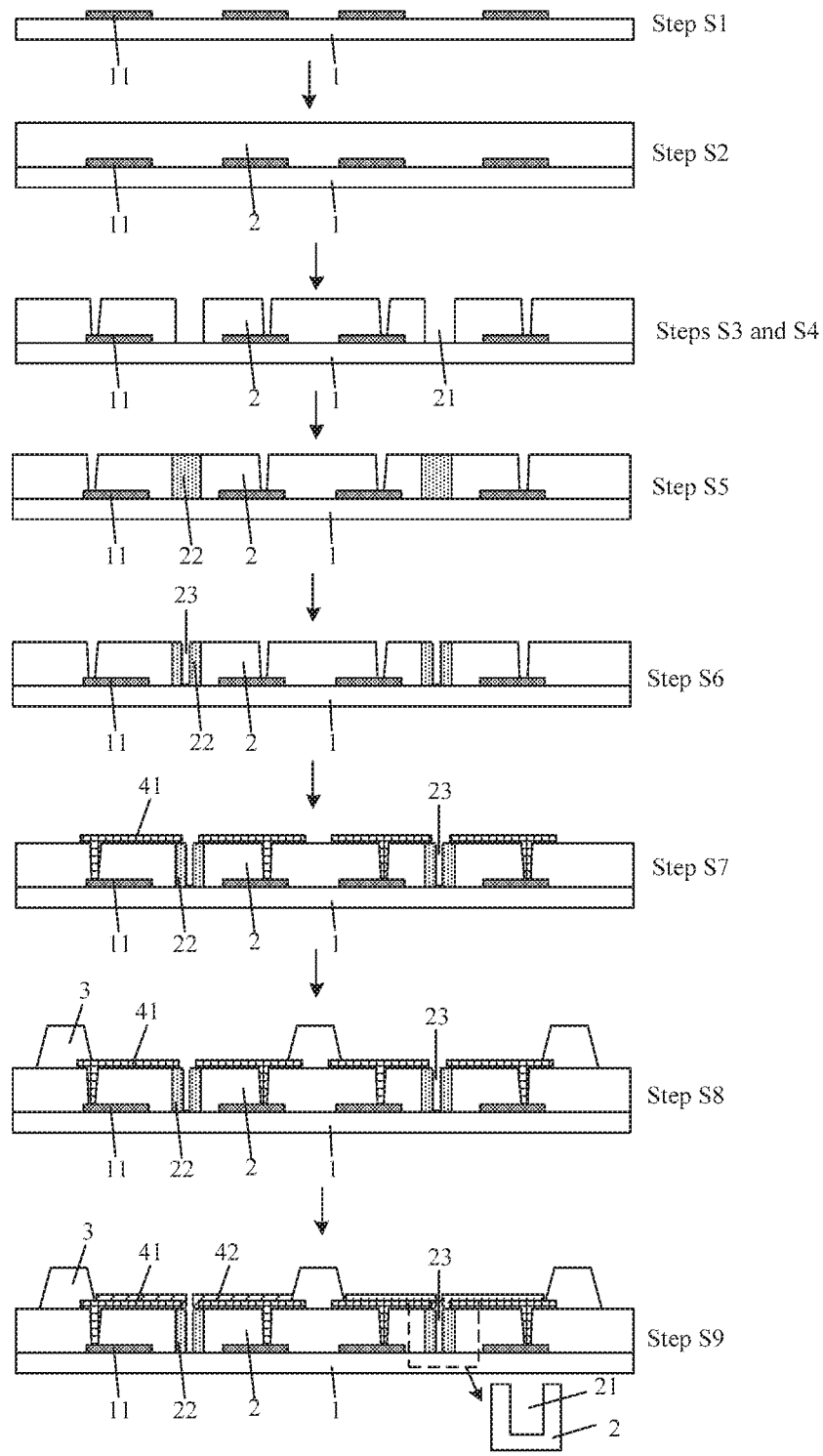
FIG. 11 is flowchart I for manufacturing an organic light-emitting display panel according to an embodiment of the present disclosure.

In a first manufacturing method, as shown in FIG. 11, which is flowchart I for manufacturing an organic light-emitting display panel according to an embodiment of the present disclosure, the manufacturing method for the organic light-emitting display panel includes steps performed in the following order. At Step S1, an array substrate 1 is provided, on which a plurality of pixel driving circuits 11 is provided. At Step S2, a planarization layer 2 is formed on the array substrate 1. At Steps S3 and S4, which can be performed at the same time, a plurality of connecting holes corresponding to the plurality of pixel driving circuits 11 is provided on the planarization layer 2, and a plurality of grooves 21 is provided in the planarization layer 2. At Step S5, each of the plurality of grooves 21 is filled with a hydrophobic material to form a hydrophobic layer 22. At Step S6, a trench 23 is provided in the hydrophobic layer 22. At Step S7, on the array substrate 1 having the planarization layer 2 formed thereon, a plurality of anodes 41 included in the plurality of organic light-emitting devices 4 is formed, and the plurality of anodes 41 is electrically connected to the pixel driving circuits 11 through the plurality of connecting holes in one-to-one correspondence. At Step S8, on the array substrate 1 having a plurality of anodes 41 formed thereon, a pixel defining layer 3 is formed, the pixel defining layer 3 includes a plurality of pixel apertures, and each of the plurality of pixel apertures corresponds to at least two organic light-emitting devices 4. At Step S9, on the array substrate 1 having a plurality of anodes 41 formed thereon, at least one organic light-emitting function layer 42 included in each of the plurality of organic light-emitting devices 41 is formed by means of ink-jet printing.

In this case, an end of the anode 41 lies on the hydrophobic layer 22, that is, the edge of the anode 41 exceeds the edge of the hydrophobic layer 22 (i.e., the edge of the groove 21). Of course, the edge of the anode 41 does not exceed that of the trench 23, and otherwise adjacent anodes 41 will be electrically connected and then independent control of the organic light-emitting devices 4 may not be achieved. An end of the anode 41 lies on the hydrophobic layer 22, such that a coverage range of the anode 41 is large, and a distance between adjacent anodes 41 is small, which can facilitate increasing the aperture ratio of the organic light-emitting display panel.

Figure 12:
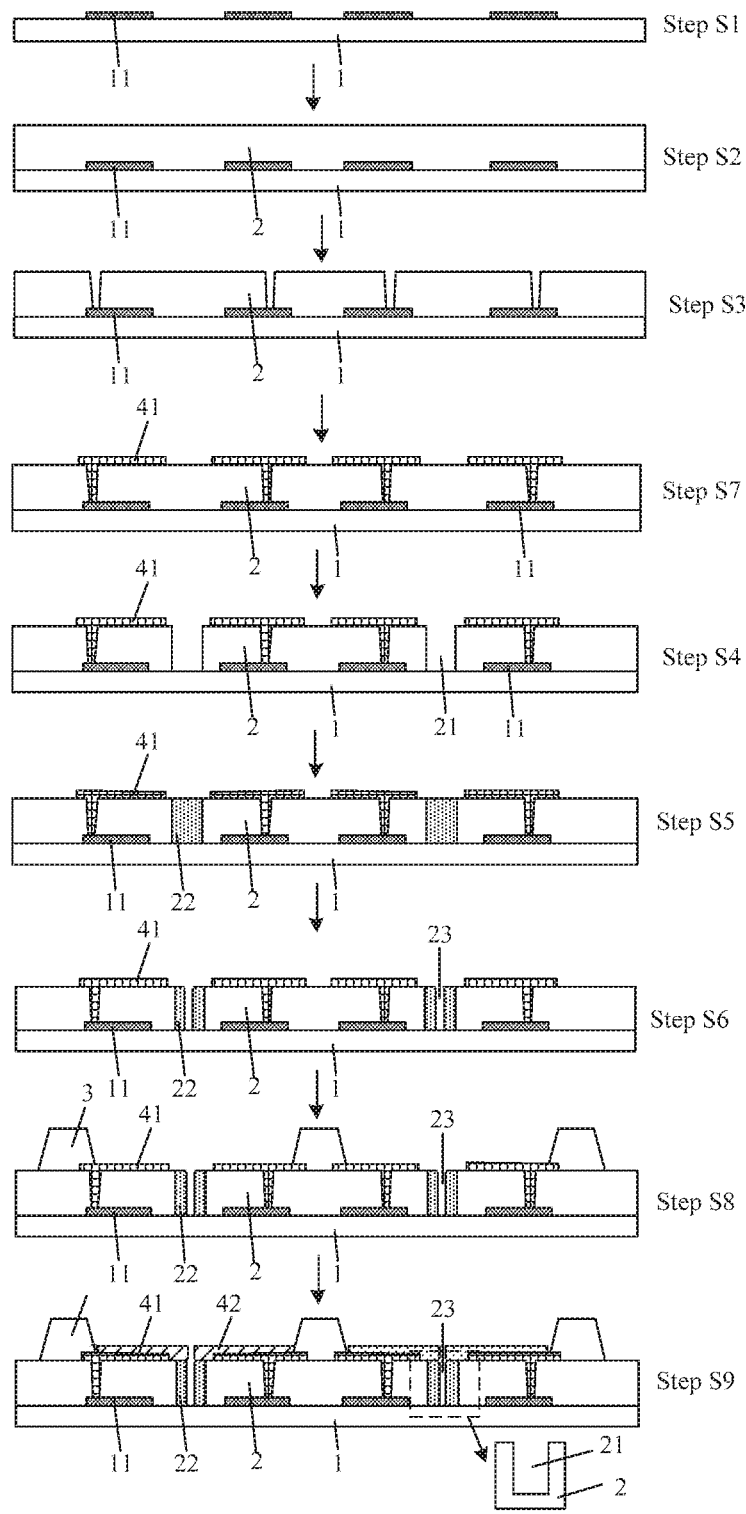
FIG. 12 is flowchart II for manufacturing an organic light-emitting display panel according to an embodiment of the present disclosure.

In a second manufacturing method, as shown in FIG. 12, which is flowchart II for manufacturing an organic light-emitting display panel according to an embodiment of the present disclosure, the manufacturing method for the organic light-emitting display panel includes steps performed in the following order. At Step S1, an array substrate 1 is provided, on which a plurality of pixel driving circuits 11 is provided. At Step S2, a planarization layer 2 is formed on the array substrate 1. At Step S3, a plurality of connecting holes corresponding to the plurality of pixel driving circuits 11 is provided on the planarization layer 2. At Step S7, on the array substrate 1 having the planarization layer 2 formed thereon, a plurality of anodes 41 included in the plurality of organic light-emitting devices 4 is formed, and the plurality of anodes 41 is electrically connected to the pixel driving circuits 11 through the plurality of connecting holes in one-to-one correspondence. At Step 4, a plurality of grooves 21 is provided in the planarization layer 2. At Step S5, each of the plurality of grooves 21 is filled with a hydrophobic material to form a hydrophobic layer 22. At Step S6, a trench 23 is provided in the hydrophobic layer 22. At Step S8, on the array substrate 1 having anodes 41 formed thereon, a pixel defining layer 3 is formed, the pixel defining layer 3 includes pixel apertures, and each of the plurality of pixel apertures corresponds to at least two organic light-emitting devices 4. At Step S9, on the array substrate 1 having a plurality of anodes 41 formed thereon, at least one organic light-emitting function layer 42 included in each of the plurality of organic light-emitting devices 41 is formed by means of ink-jet printing.

There can be various implementations for the above step S5, in which each of the plurality of grooves 21 is filled with a hydrophobic material to form a hydrophobic layer 22. In an exemplary embodiment, a layer of a hydrophobic material is formed on the planarization layer 2, and only the hydrophobic material filled in the grooves 21 is maintained by patterning process to form the hydrophobic layer 22. In another exemplary embodiment, the hydrophobic layer 22 is formed by filling the hydrophobic material into the groove 21 by means of ink jet printing.

It should be noted that the above description with respect to the organic light-emitting display panel is applicable to the manufacturing method for the organic light-emitting display panel, which will not be repeated herein.

The present disclosure provides an organic light-emitting display panel, a manufacturing method thereof, and an organic light-emitting display device. The pixel defining layer 3 included in the organic light-emitting display panel includes a plurality of pixel apertures, each of which is provided therein with at least two organic light-emitting devices 4 for emitting a same color. However, the planarization layer 2 is provided therein with a plurality of grooves 21, the groove 21 is disposed between two adjacent organic light-emitting devices 4 in a respective one pixel aperture, each the groove 21 is filled with a hydrophobic layer 22, the hydrophobic layer 22 is provided therein with a plurality of trenches 23, and an extending direction of each trench 23 is the same as an extending direction of each groove 21. As a result, when each organic light-emitting function layer 42 is formed by means of ink-jet printing, a wet film will cover the hydrophobic layer 22 and the trench 23 provided therein in a wet film status. However, solid content in the wet film is small (generally about 5%), and the hydrophobic layer 22 has hydrophobicity and is provided therein with a plurality of trenches 23, therefore, the formed film layer will break at the trench 23 after the wet film is dried, such that the organic light-emitting function layer 42 breaks at each trench 23, and thus the mutual influence between organic light-emitting devices 4 can be avoided, thereby effectively improving the display effect of the organic light-emitting display panel and improving the human perception.

What is claimed is:

1. An organic light-emitting display panel, comprising:
an array substrate;
a plurality of pixel driving circuits disposed on the array substrate;
a planarization layer disposed on the array substrate, wherein a plurality of connection holes corresponding to the plurality of pixel driving circuits is provided in the planarization layer;
a pixel defining layer disposed on the planarization layer, wherein the pixel defining layer comprises a plurality of pixel apertures; and a plurality of organic light-emitting devices, wherein at least two organic light-emitting devices of the plurality of organic light-emitting devices for emitting a same color are disposed in each of the plurality of pixel apertures, each of the plurality of organic light-emitting devices comprises an anode and at least one organic light-emitting function layer, and anodes of the plurality of organic light-emitting devices are electrically connected to the plurality of pixel driving circuits through the plurality of connection holes in one-to-one correspondence, wherein a plurality of grooves is provided in the planarization layer, wherein one groove of the plurality of grooves is disposed between two adjacent organic light-emitting devices of the plurality of organic light-emitting devices disposed in a respective one of the plurality of the pixel apertures; the plurality of grooves is filled with a hydrophobic layer having a trench, an extending direction of the trench in each groove of the plurality of grooves is the same as an extending direction of said groove.

2. The organic light-emitting display panel according to claim 1, wherein a respective one of the at least one organic light-emitting function layer breaks at the trench.

3. The organic light-emitting display panel according to claim 1, wherein the hydrophobic layer has a wetting angle larger than 90°.

4. The organic light-emitting display panel according to claim 3, wherein the wetting angle of the hydrophobic layer is 100°.

5. The organic light-emitting display panel according to claim 1, wherein the hydrophobic layer is made of an acrylic material.

6. The organic light-emitting display panel according to claim 1, wherein each of the plurality of grooves has a depth equal to a thickness of the planarization layer in a direction perpendicular to the array substrate.

7. The organic light-emitting display panel according to claim 1, wherein the trench has a width smaller than 2 μm, and the trench has a depth larger than or equal to 0.5 μm in a direction perpendicular to the array substrate.

8. The organic light-emitting display panel according to claim 1, wherein the trench in each groove of the plurality of grooves has a depth equal to a depth of the groove in a direction perpendicular to the array substrate.

9. The organic light-emitting display panel according to claim 1, wherein the trench in each groove of the plurality of grooves has a cross-section shaped as a trapezium.

10. The organic light-emitting display panel according to claim 9, wherein the trench in each groove of the plurality of grooves has a basic angle larger than 45° and smaller than 90°.

11. The organic light-emitting display panel according to claim 1, wherein the anode of each organic light-emitting device of the plurality of organic light-emitting devices has an end lying on the hydrophobic layer in one corresponding groove of the plurality of grooves.

12. The organic light-emitting display panel according to claim 1, wherein each of the plurality of pixel apertures has a shape selected from a regular triangle shape, a hexagon shape, or a rectangle shape, wherein when each of the plurality of pixel apertures has the regular triangle shape, a number of the at least two organic light-emitting devices of the plurality of organic light-emitting devices for emitting a same color disposed in each of the plurality of pixel apertures is three, wherein when each of the plurality of pixel apertures has the hexagon shape, a number of the at least two organic light-emitting devices of the plurality of organic light-emitting devices for emitting a same color disposed in each of the plurality of pixel apertures is six, and wherein when each of the plurality of pixel apertures has the rectangle shape, a number of the at least two organic light-emitting devices of the plurality of organic light-emitting devices for emitting a same color disposed in each of the plurality of pixel apertures is four.

13. An organic light-emitting display device, comprising an organic light-emitting display panel, wherein the organic light-emitting display panel comprises:

an array substrate;

a plurality of pixel driving circuits disposed on the array substrate;

a planarization layer disposed on the array substrate, wherein a plurality of connection holes corresponding to the plurality of pixel driving circuits is provided in the planarization layer;

a pixel defining layer disposed on the planarization layer, wherein the pixel defining layer comprises a plurality of pixel apertures; and a plurality of organic light-emitting devices, wherein at least two organic light-emitting devices of the plurality of organic light-emitting devices for emitting a same color are disposed in each of the plurality of pixel apertures, each of the plurality of organic light-emitting devices comprises an anode and at least one organic light-emitting function layer, and anodes of the plurality of organic light-emitting devices are electrically connected to the plurality of pixel driving circuits through the plurality of connection holes in one-to-one correspondence, wherein a plurality of grooves is provided in the planarization layer, wherein one groove of the plurality of grooves is disposed between two adjacent organic light-emitting devices of the plurality of organic light-emitting devices disposed in a respective one of the plurality of the pixel apertures; the plurality of grooves is filled with a hydrophobic layer having a trench, an extending direction of the trench in each groove of the plurality of grooves is the same as an extending direction of said groove.

14. A manufacturing method for an organic light-emitting display panel, comprising:

providing an array substrate on which a plurality of pixel driving circuits is provided;

forming a planarization layer on the array substrate;

forming, in the planarization layer, a plurality of connection holes corresponding to the plurality of pixel driving circuits;

forming a plurality of grooves in the planarization layer;

filling each of the plurality of grooves with a hydrophobic material to form a hydrophobic layer;

forming a trench in the hydrophobic layer;

forming a plurality of anodes included by a plurality of organic light-emitting devices, wherein the plurality of anodes is electrically connected to the plurality of pixel driving circuits through the plurality of connection holes in one-to-one correspondence;

forming a pixel defining layer on the array substrate having the plurality of anodes, wherein the pixel defining layer comprises a plurality of pixel apertures, and each of the plurality of pixel apertures corresponds to at least two of the plurality of organic light-emitting devices; and forming at least one organic light-emitting function layer of each of the plurality of organic light-emitting devices by means of ink-jet printing, wherein at least two of the plurality of organic light-emitting devices for emitting a same color are disposed in each of the plurality of pixel apertures, and wherein one of the plurality of grooves is disposed between two adjacent organic light-emitting devices of the plurality of organic light-emitting devices disposed in a respective one of the plurality of the pixel apertures, and an extending direction of the trench in each groove of the plurality of grooves is the same as an extending direction of said groove.

15. The manufacturing method according to claim 14, wherein a respective one of the at least one organic light-emitting function layer breaks at the trench.

16. The manufacturing method according to claim 14, wherein the plurality of connection holes and the plurality of grooves are formed on the planarization layer in one process step, and following the process step, the hydrophobic material is filled in each of the plurality of grooves to form the hydrophobic layer and the trench is formed in the hydrophobic layer in each of the plurality of grooves; and then, the plurality of anodes included by the plurality of organic light-emitting devices are formed, wherein each of the plurality of anodes has an end lying on the hydrophobic layer in one corresponding groove of the plurality of grooves.

17. The manufacturing method according to claim 14, wherein after the plurality of connection holes corresponding to the plurality of pixel driving circuits is formed in the planarization layer, the plurality of anodes included by the plurality of organic light-emitting devices is formed, wherein the plurality of anodes is electrically connected to the plurality of pixel driving circuits through the plurality of connection holes in one-to-one correspondence, and thereafter the plurality of grooves are formed in the planarization layer.

18. The manufacturing method according to claim 14, wherein filling each of the plurality of grooves with a hydrophobic material to form a hydrophobic layer comprises:

forming a layer of hydrophobic material on the planarization layer, and maintaining only the hydrophobic material filled in the plurality of grooves by means of a patterning process.

19. The manufacturing method according to claim 14, wherein filling each of the plurality of grooves with a hydrophobic material to form a hydrophobic layer comprises:

filling each of the plurality of grooves with the hydrophobic material by means of ink-jet printing.

* * * * *